US007132637B2

(12) United States Patent
Nygard

(10) Patent No.: US 7,132,637 B2
(45) Date of Patent: Nov. 7, 2006

(54) PIXEL SENSOR ARRAY HAVING A LAYER OF SENSOR MATERIAL GROWN ON A PRE-FABRICATED WAFER AND METHOD OF MANUFACTURE THEREOF

(75) Inventor: Einar Nygard, Asker (NO)

(73) Assignee: Interon AS, Asker (NO)

( * ) Notice: Subject to any disclaimer, the term of this patent is extended or adjusted under 35 U.S.C. 154(b) by 93 days.

(21) Appl. No.: 10/506,497

(22) PCT Filed: Feb. 18, 2003

(86) PCT No.: PCT/IL03/00125

§ 371 (c)(1),
(2), (4) Date: Sep. 3, 2004

(87) PCT Pub. No.: WO03/083944

PCT Pub. Date: Oct. 9, 2003

(65) Prior Publication Data

US 2005/0121598 A1    Jun. 9, 2005

(30) Foreign Application Priority Data

| Mar. 3, 2002 | (IL) | ..................................... 148463 |
| Jul. 23, 2002 | (IL) | ..................................... 150867 |

(51) Int. Cl.
*H01L 27/00* (2006.01)
*H01J 40/14* (2006.01)
(52) U.S. Cl. ............... 250/208.1; 250/214.1; 438/57
(58) Field of Classification Search ............ 250/208.1, 250/214.1, 214 R; 438/57–60, 64–67, 73–81; 257/222, 225, 232, 257–258, 288–291

See application file for complete search history.

(56) References Cited

U.S. PATENT DOCUMENTS

| 4,104,674 A | 8/1978 | Lorenze, Jr. et al. |
| 4,547,792 A | 10/1985 | Sclar |

(Continued)

FOREIGN PATENT DOCUMENTS

EP    0 415 541 A1    3/1991

(Continued)

OTHER PUBLICATIONS

Benthien, et al, "A Vertically Integrated High Resolution Active Pixel Image Sensor for Deep Submicron CMOS Processes", IEEE Workshop on CCDs and Advanced Image Sensors, Nagano, Japan, Jun. 10-12, 1999.

*Primary Examiner*—Stephone B. Allen
*Assistant Examiner*—Patrick J. Lee
(74) *Attorney, Agent, or Firm*—Browdy and Neimark, PLLC

(57) ABSTRACT

A sensor array having a plurality of pixels each including a sensor element coupled to a sensor input (24) of an electronic processing circuit is fabricated by first forming an integrated circuit having at least one array of electronic processing circuits (25, 26) each having a respective sensor input (24) disposed with terminal nodes of the integrated circuit toward a first surface of the wafer. In respect of either each pixel or each terminal node, an electrically conductive via (31) is formed through the wafer (20) extending from either the respective sensor input (24) or from the respective terminal node to a second surface (28) of the wafer opposite the first surface. This allows each electrically conductive via (31) exposed at the second surface of the wafer to serve for connection thereto of either a sensor element or a terminal connection that is electrically connected through the electrically conductive via (31) to the respective sensor input or terminal node.

47 Claims, 8 Drawing Sheets

U.S. PATENT DOCUMENTS

| | | |
|---|---|---|
| 4,857,746 A | 8/1989 | Kuhlmann et al. |
| 5,254,868 A | 10/1993 | Saito |
| 5,734,201 A * | 3/1998 | Djennas et al. ............. 257/783 |
| 5,998,292 A | 12/1999 | Black et al. |
| 6,091,070 A * | 7/2000 | Lingren et al. ........ 250/370.09 |
| 6,510,195 B1 * | 1/2003 | Chappo et al. ............... 378/19 |
| 6,852,566 B1 * | 2/2005 | Yaung ........................ 438/74 |

FOREIGN PATENT DOCUMENTS

| | | |
|---|---|---|
| EP | 0 537 514 A2 | 4/1993 |
| EP | 1 045 450 A2 | 10/2000 |
| JP | 61-128564 A2 | 6/1986 |

\* cited by examiner first surface view ↑ first surface view ↑ first surface view ↑

Object flipped from previous drawing second surface view ↓ second surface view ↓

Growth of amorphous or polycrystalline sensor material first surface view ↑

Object flipped from Fig. 7

PIXEL SENSOR ARRAY HAVING A LAYER OF SENSOR MATERIAL GROWN ON A PRE-FABRICATED WAFER AND METHOD OF MANUFACTURE THEREOF

FIELD OF THE INVENTION

This invention relates to pixel sensors for use in cameras, and in particular to such sensors as are used in nuclear and medical imaging systems.

BACKGROUND OF THE INVENTION

Pixel sensors are known to comprise an array of sensor elements such as diodes, and a complementary array of electronics, typically in the form of an ASIC and comprising a charge amplifier and processing electronics for each sensor element. In CCDs such as are used in miniature television cameras and the like, the sensor elements are formed of silicon diodes which are responsive to visible light for producing a current which is amplified by the charge amplifier and subsequently processed.

Pixel sensors for nuclear medical imaging are known that respond to high-energy photons such as X-rays or γ-rays and produce charge in a similar manner. Conventional silicon diodes are not suitable for such applications because they are transparent to the high-energy photons and therefore other materials such as cadmium telluride or mercury iodide are used instead. Since these materials are not based on silicon, the diode cannot be integrated together with the associated electronics as a single monolithic structure and this requires, in practice, that the sensor elements and the associated electronics be manufactured on separate wafers, which are then interconnected using bump bonding.

FIG. 1 shows pictorially a typical arrangement comprising a standalone 2-D pixel sensor depicted generally as 10 and comprising an upper sensor array 11 comprising multiple sensor elements (not shown), each of which is bump-bonded to a corresponding electronics module in a lower ASIC 12. In addition, power and control signals are fed to the sensor 10 and this typically requires that control-pads 13 be formed along at least one edge of the composite chip and which may be connected to external circuitry using wire-bonding 14.

The typical size of each pixel in such an array is 200 μm and the typical dimensions of the two-dimensional array is 1 cm$^2$. This means that there are typically some 625 pixels per pixel array. In practice, it is usually necessary to image over a much larger area, for example at least 10×10 cm$^2$. This requires that 100 pixel arrays must be packed together, for example as a 10×10 matrix. On the one hand, the bump bonding technique used in conventional pixel sensors militates against the closer packing density of the pixels so that it becomes difficult to increase the resolution of the sensor by packing more pixels into a pixel array, since the need to bump-bond each sensor to the corresponding electronics in a different array is a costly process and is subject to low yields. Furthermore, the provision of control-pads along an edge of each module and the need to wire bond these pads to external circuitry means that adjacent sensor arrays cannot be packed edge-to-edge without introducing a "dead" zone where there are, in fact, no pixels at all owing to the interposing I/O and control-pads. Moreover, the connection of the I/O control-pads to the external circuitry by wire bonding is also a costly and cumbersome process and further reduces the effective overall packing density.

EP 0415541 assigned to Shimadzu Corporation, published Mar. 6, 1991 and entitled "Semiconductor-based radiation image detector and its manufacturing method" discloses a radiation image detector for detecting a radiation image with the image divided into pixels. The detector comprises a radiation-sensitive semi-conductor plate having a common bias electrode deposited on one surface thereof. A plurality of pixel-corresponding signal takeout electrodes are deposited on the other surface of the semiconductor plate, and a plurality of bumps are provided each of which is fixed on a respective one of the signal takeout electrodes. A passivation film covers each signal takeout electrode where not in contact with its bump, and covering the clearances between the signal takeout electrodes. A base plate is provided with a plurality of contact pads corresponding to and in contact with the bumps.

U.S. Pat. No. 5,254,868 (Yutaka) published Oct. 19, 1993 and entitled "Solidstate image sensor device" discloses a semiconductor image sensor device comprising arrayed photo-sensors, wherein a connection electrode used for connecting an external circuit or an aperture on the connection electrode is provided at an opposite side surface to an illuminated surface, and a transparent substrate is provided above the arrayed photo-sensors. By such means the distance between a light source and the photo-sensors can be reduced so as to improve sensitivity and resolving power.

U.S. Pat. No. 5,998,292 (Black et al.) issued Dec. 7, 1999 and entitled "Method for is making three dimensional circuit integration" discloses a method for inter-connecting, through high-density micro-post wiring, multiple semiconductor wafers with lengths of about a millimeter or below. The method comprises etching at least one hole, defined by walls, at least partly through a semiconducting material; forming a layer of electrically insulating material to cover said walls; and forming an electrically conductive material on said walls within the channel of the hole.

JP 61 128564A2 (Fujitsu Ltd.) published Jun. 16, 1986 and entitled "Semiconductor Device" describes a process for forming a photodetecting section and a driving circuit on the surface and the back of the same substrate and connecting both by a wiring through a through-hole. An amplifier and other driving circuits are shaped to a Si growth layer, and an n type region is formed through the implantation of B+ ions in order to shape a P-N junction for a photodetecting element. Aluminum for a wiring is shaped so as to unit one part of the n type region and the Si growth layer side where the driving circuit is formed, and shaped through a method, such as ion beam evaporation, electron beam evaporation, etc. while masking sections except a required section. Aluminum is evaporated from both upper and lower surfaces, and the wiring is connected by plating. A HgCdTe growth section in the photo-detecting element section and the Si growth layer are displaced, and formed on both surfaces of a sapphire substrate.

Such a configuration appears to relate to a single photodetector only and the silicon is not pre-fabricated but rather is grown on top of the sapphire substrate.

EP1 045 450A2 (Agilent Technologies Inc.) published Oct. 18, 2003 and entitled "Image sensor array device" discloses an image sensor array that includes a substrate. An interconnect structure is formed adjacent to the substrate. An amorphous silicon electrode layer is adjacent to the interconnect structure. The amorphous silicon electrode layer includes electrode ion implantation regions between pixel electrode regions. The pixel electrode regions define cathodes of an array of image sensors. The electrode ion implantation regions provide physical isolation between the pixel electrode regions. The cathodes are electrically connected to the interconnect structure. An amorphous silicon I-layer is adjacent to the amorphous silicon electrode layer. The amorphous silicon I-layer forms an inner layer of each of the image sensors. A transparent electrode layer is formed adjacent to the image sensors. An inner surface of the transparent electrode layer is electrically connected to anodes of the image sensors and the interconnect structure. The amorphous silicon I-layer can further include I-layer ion implantation regions that provide physical isolation between the inner layers of the image sensors. The I-layer ion implantation regions align with the electrode ion implantation regions. An amorphous silicon P-layer can be formed adjacent to the amorphous silicon I-layer. The amorphous silicon P-layer forms an outer layer of each of the image sensors. The amorphous silicon P-layer can include P-layer ion implantation regions that provide physical isolation between the outer layers of the image sensors.

EP 537 514A2 (Mitsubishi corporation) published Apr. 21, 1993 and entitled "Optoelectronic integrated circuit" discloses an optoelectronic integrated circuit including a light receiving element for converting an optical signal to an electric signal and an electronic circuit for processing the electric signal. The light receiving element is disposed on a first main surface of the substrate and includes p side electrodes and n side electrodes alternately arranged in parallel to each other. The electronic circuit is disposed on a second main surface of the substrate. The light receiving element is electrically connected to the electronic circuit by a via hole penetrating through the substrate.

U.S. Pat. No. 4,547,792 (Sclar) issued Oct. 15, 1985 and entitled "Selective access array integrated circuit" discloses a semiconductor integrated circuit having an array of electronic devices and a plurality of electronic access devices. The access devices consist of sets of MOSFETs which may be turned on by the joint action of X and Y address lines to permit individual and isolated electrical connection between selected electronic devices in the array and peripheral on or off-chip sensing circuits. This permits continuous readout to be established and maintained for the selected devices without interference with the other devices in the array and without a requirement to readout any but the selected devices. In order to provide minimum dead space between the array detectors, the array and access devices may be disposed on opposite surfaces of the semiconductor body.

U.S. Pat. No. 4,857,746 (Werner et al.) issued Aug. 15, 1989 and entitled "Method for producing an optocoupler" discloses a method for manufacturing optocouplers or reflex light barriers, wherein semiconductor light transmitters and semiconductor light receivers are situated on a single substrate. The optic coupling or optic isolation of light transmitter and light receiver takes place in the substrate. Only then are semiconductor elements separated into discrete units.

None of the above cited references appears to relate to a multi-sensor detector where a silicon substrate is pre-fabricated to include all the sensor electronics and input connections; and wherein a sensor layer is then grown on top of the pre-fabricated substrate and connects to the input connections therein by means of vias pre-formed in the substrate.

12, 1999. This article describes a multi-pixel CMOS May for visible light applications, such as photography. It employs thin ASIC (TFA) technology to deposit an amorphous silicon detector on a pre-fabricated ASIC. The article does not address the need for a multi-pixel sensor array that is amenable to formation of a large area sensor assembly having multiple sensor arrays juxtaposed and makes no provision for such assembly.

None of the above cited references appears to relate to a multi-sensor detector where a silicon substrate is pre-fabricated to include all the sensor electronics and input connections; wherein a sensor layer is then grown on top of the pre-fabricated substrate and connect to the input connections therein by means of vias pre-formed in the substrate; and wherein teal nodes for external connection of control signals etc. are formed on an opposite surface to the sensor layer thus avoiding dead space in the sensor material and permitting multiple sensor arrays to be juxtaposed so as to create large area sensors having substantially continuous sensitivity across the surface.

SUMMARY OF THE INVENTION

It is thus an object of the invention to provide an improved low-cost pixel sensor, which is amenable to closer packing obviates the above-mentioned drawbacks that are contingent on the use of bump-bonding and the provision of I/O control-pads and allows multiple sensor modules to be juxtaposed so as to form a larger area sensor without requiring any further manufacturing process after assembly.

These objects are realized in accordance with a first embodiment of the invention by a method for fabricating a sensor array having a plurality of pixels, each pixel including an electronic processing circuit having a sensor input for coupling a sensor element to the electronic processing circuit, the sensor array further having a plurality of terminal nodes for external connection to respective electronic processing circuits of multiple pixels of power, I/O and control connections, the method comprising:

integrating the electronic processing circuits on a wafer so as to form an integrated circuit having at least one any of said electronic processing circuits with the sensor inputs and the terminal nodes being accessible from a first surface of the wafer;

in respect of each pixel, providing an electrically conductive via through the wafer extending from the respective sensor input to a second surface of the wafer opposite the first surface; and depositing sensor material on the second surface of the wafer so that an unexposed surface thereof forms multiple electrodes each in registration with a corresponding one of the electrically conductive vias.

According to a variation of such a method there is provided a method for fabricating a sensor array having a plurality of pixels, each pixel including an electronic processing circuit having a sensor input for coupling a sensor element to the electronic processing circuit, the sensor array further having a plurality of terminal nodes for external connection to respective electronic processing circuits of multiple pixels of power, I/O and control connections, the method comprising:

integrated the electronic processing circuits on a wafer so as to form an integrated circuit having at least one array of said electronic processing circuits with the sensor inputs being accessible from a first surface of the wafer;

providing a plurality of electrically conductive vias through the wafer extending to a second surface of the wafer opposite the first surface, each of said electrically conductive vias being in registration with a respective terminal node in the sensor array; and depositing sensor material on the first surface of the wafer so that an unexposed sure thereof forms multiple electrodes each in registration with the respective sensor input of a corresponding electronic processing circuit.

According to another aspect the invention provides a multi-pixel sensor array comprising:

a wafer having integrated therein multiple electronic processing circuits each in respect of a respective pixel so as to form an integrated circuit having at least one array of electronic processing circuits each electronic processing circuit having a respective sensor input, the sensor array further having a plurality of nodes accessible from a first surface of the wafer for external connection to respective electronic processing circuits of multiple pixels of power, I/O and control connections, in respect of each pixel, an electrically conductive via through the wafer extending from the respective sensor input to a second surface of the wafer opposite the fist surface, and a layer of sensor material deposited on the second surface of the wafer so as to form a array of sensor element, so that an unexposed surface thereof forms multiple electrodes each in registration with a corresponding one of the electrically conductive vias.

According to yet another aspect, the invention provides a multi-pixel sensor array comprising:

a wafer having integrated therein multiple electronic processing circuits each in respect of a respective pixel so as to form an integrated circuit having at least one array of electronic processing circuits each electronic processing having a respective sensor input accessible from a first surface of the wafer, the sensor array further having a plurality of terminal nodes for external connection to respective electronic processing circuits of multiple pixels of power, I/O and control connections, in respect of each terminal node, an electrically conductive via through the wafer extending from the respective terminal node in the sensor array to a second surface of the wafer opposite the first surface, and a layer of sensor material deposited on the first face of the wafer so as to form an array of sensor elements, so that an opposite unexposed surface thereof forms multiple electrodes each in registration with the respective sensor input of a corresponding electronic processing circuit.

a layer of sensor material deposited on the first surface of the wafer so as to form an array of sensor elements, so that an exposed surface of the sensor material forms a first electrode that is common to all sensor elements towards which incident photons are directed, and an opposite unexposed surface thereof forms multiple second electrodes each in registration with the respective sensor input of a corresponding electronic processing circuit.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF SPECIFIC EMBODIMENTS

Figure 1:
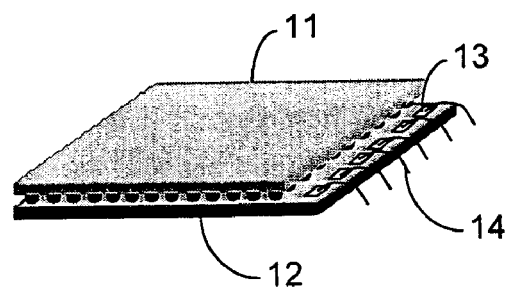
FIG. 1 shows pictorially a typical prior-art pixel sensor assembly.
Figure 2:
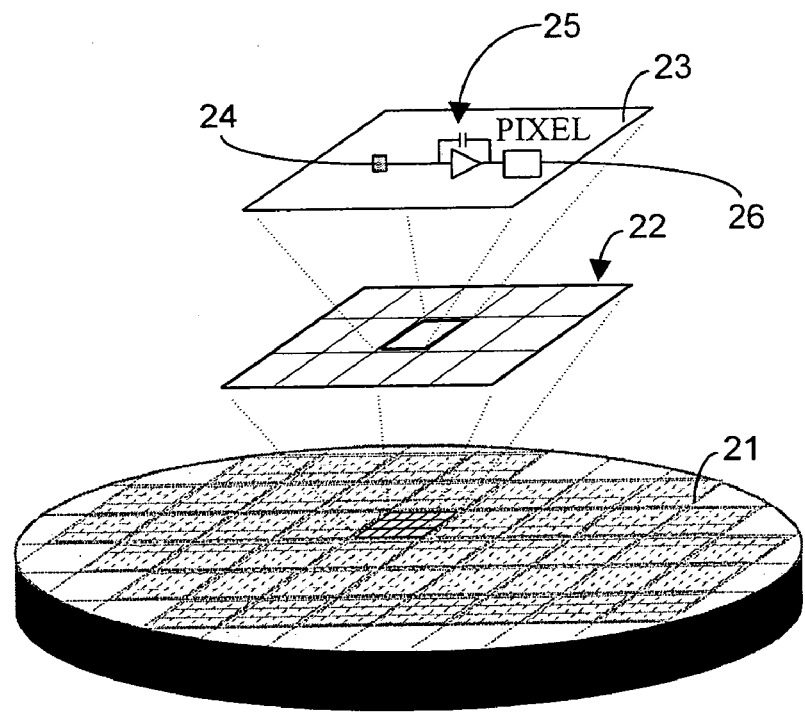
FIG. 2 shows pictorially a standard pixel ASIC that is mass-manufactured on a silicon wafer in a first manufacturing step according to the invention.
Figure 3:
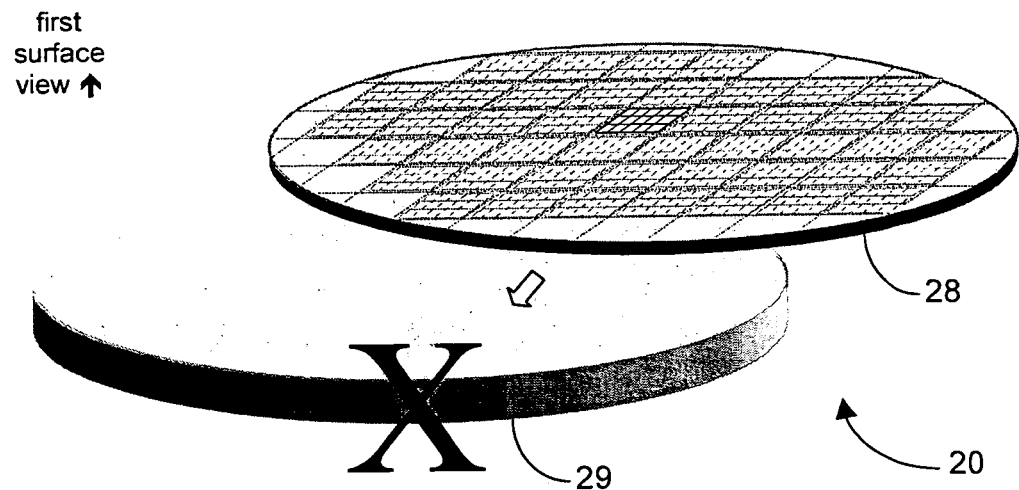
FIG. 3 shows pictorially the silicon wafer undergoing an optional second manufacturing step according to the invention.

FIG. 2 shows a silicon wafer 20 constituting an integrated circuit or chip, typically formed of a complementary metal oxide semiconductor (CMOS) wafer and being provided with scribe lines 21 so as to form a rectangular matrix of sensor elements 22 each of which, in turn, comprises a matrix of 3×5 pixels 23. The wafer 20 is processed at a silicon foundry in known manner and for the purpose of low-cost mass-production is processed according to the invention as an uncut wafer bearing multiple replicas of the same integrated circuit. Each pixel 23 includes a sensor input 24 that is connected to a charge amplifier 25 and a processing unit 26. The charge amplifier 25 together with the processing unit 26 constitute the pixel electronics to which the sensor element (not shown) is connected and which responds to a photon striking the sensor element for measuring the charge produced thereby. Thus, the silicon wafer 20 contains multiple replicas of the pixel array 22 which, after scribing, would produce multiple ASICs each containing an array of 3×5 pixel electronic circuits for connecting to a respective sensor element.

Optionally, the standard wafer 20 shown in FIG. 2 may be ground or etched so as to thin down the wafer from the reverse side 28 so as to remove the bulk of the silicon wafer 29, whereby the remainder of the wafer 20 is as thin as practically possible. It is also possible to use a pre-thinned wafer in the IC fabrication described above, in which case subsequent thinning is unnecessary. A pre-thinned wafer will, however, result in a higher manufacturing cost when mass-producing the pixel electronics.

In order to obviate the need for wire bonding as is used in hitherto proposed pixel sensors, the invention connects each sensor input 24 via a respective ohmic contact (or "via")

through the silicon wafer to the reverse side thereof. This contact may then be used to connect the sensor element directly to the sensor electronics by effectively bonding the sensor element in correct spatial disposition with respect to the electronics on the reverse side of the silicon wafer. This may be done in various ways, some of which will now be described.

Figure 4:
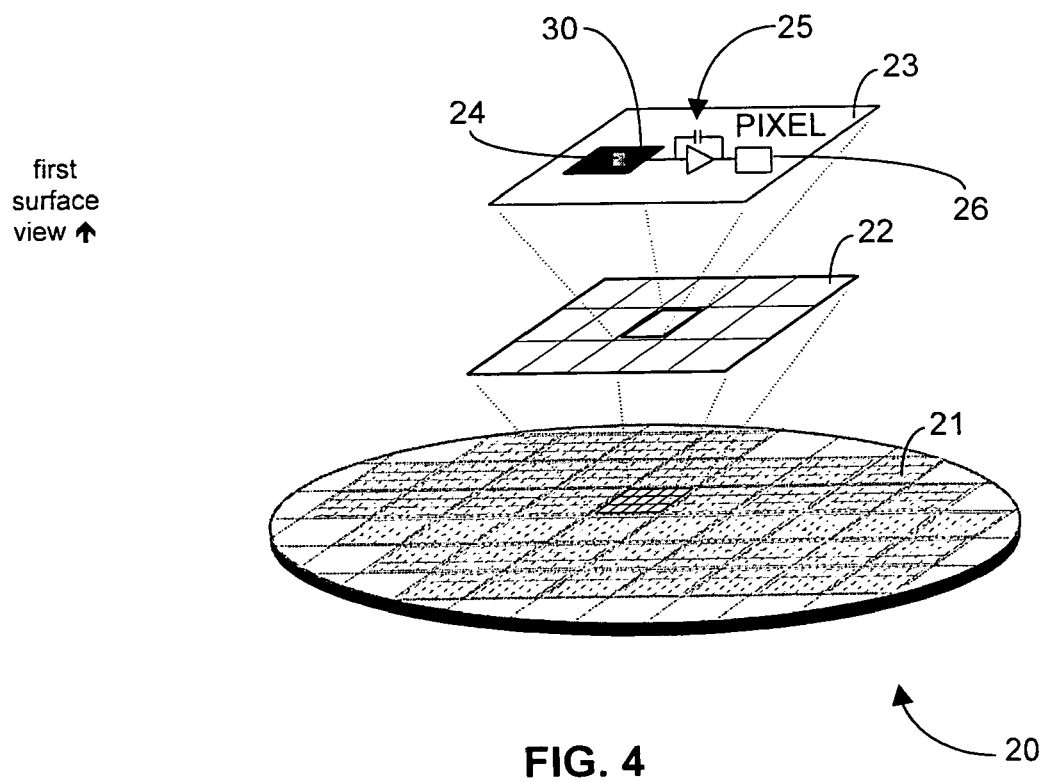
FIG. 4 shows pictorially a third manufacturing step according to the invention.
Figure 5:
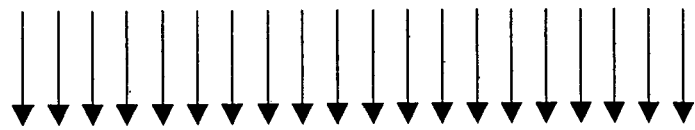
FIG. 5 shows pictorially a fifth manufacturing step according to the invention for producing ohmic connections between each pixel input and a reverse side of the silicon wafer for allowing direct connection thereto of a pixel sensor.
Figure 5:
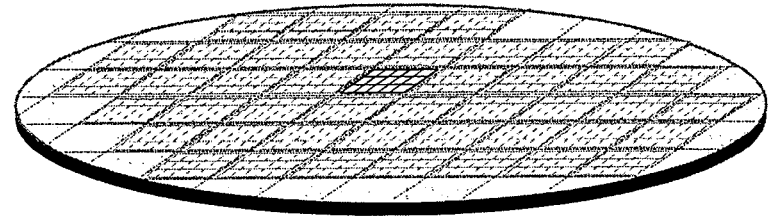
Figure 6:
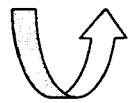
FIG. 6 shows pictorially the reverse side of the silicon wafer including the multiple ohmic contacts produced according to the invention, each being associated with a respective sensor.
Figure 6:
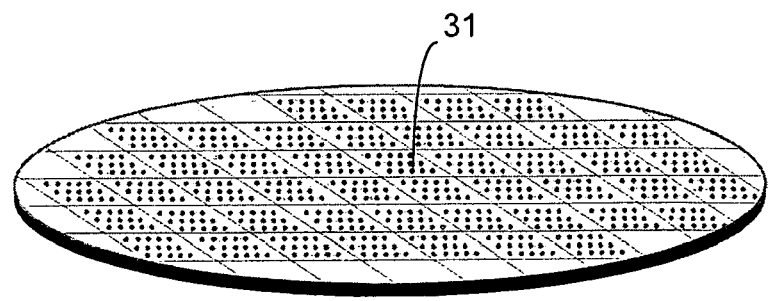

Thus, referring to FIG. 4 the sensor element 24 is coated with extra photomask material 30, which effectively protects the area of the wafer surrounding the sensor input 24, whilst leaving the sensor input 24 itself exposed. It may also be necessary to produce a complementary photomask that covers the same region but is provided on the reverse side 28 of the silicon wafer in precise registration with the photomask that is disposed on the pixel 23. Once this is done, a connection may be formed to the sensor input 24 through the wafer by implanting the silicon wafer with an n-type donor impurity, being a pentavalent material such as antimony, phosphorus or arsenic to which the photomask 30 is impervious, so that the donor impurity penetrates only the sensor input 24 and creates a local increase in the conductivity of the silicon from the sensor input 24 through the wafer 20 to its reverse side, thus effectively forming a matrix of conductive vias 31, each of which connects a respective sensor input 24 to the reverse side of the wafer 20 as shown pictorially in FIG. 6.

An alternative approach is to provide a photomask on the reverse side only of the wafer that exposes the silicon in direct registration with the sensor input on the topside of the wafer and partially to etch holes through the wafer from the reverse side to the sensor input 24, whilst not etching all the way through the wafer. The resulting bores are then filled with conductive material such as aluminum.

Yet another possibility is to combine the two above-mentioned approaches whereby holes are partially etched through the wafer from the reverse side and a p-type impurity, such as boron, is implanted from the top side so as to render the wafer directly underneath each sensor input conductive. The partial bores are then filled with conductive material such as aluminum, which abuts the now-conductive wafer and completes the ohmic contact to the reverse side of the wafer.

Figure 7:
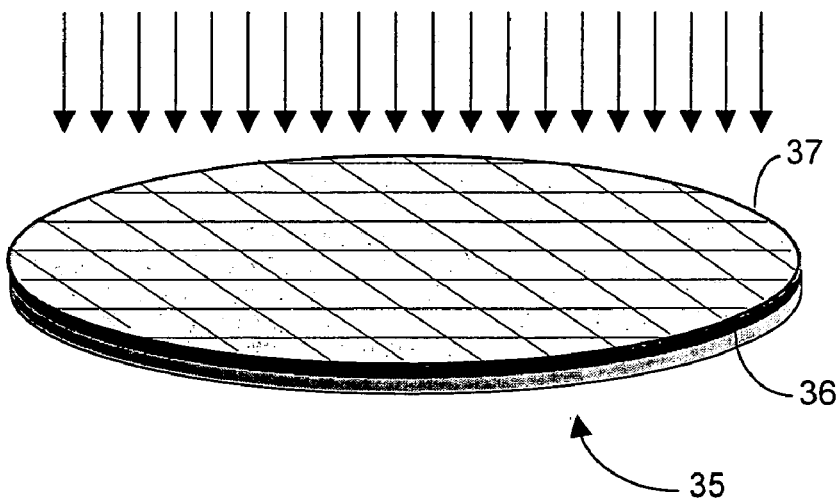
FIG. 7 shows pictorially a sixth manufacturing step according to the invention for depositing sensor material on the reverse side of the silicon wafer.

Referring to FIG. 7 there is shown a subsequent stage in the manufacturing process where desired amorphous or polycrystalline sensor material such as mercury iodide is grown on the top side of the wafer so as to for an array of sensor elements, each having an mode which is in ohmic contact wilt a respect one of the conductive vias 31 (sown in FIG. 6) and such that the opposite, exposed, surface of the sensor material forms a common cathode towards which incident photons are directed. Thus, FIG. 7 shows pictorially a composite wafer 35 having a lower silicon wafer 36 as described above, on top of which is grown au amorphous or polycrystalline sensor medial 37 so as to form a matrix of sensor elements having a common cathode constituted by the upper surface of the device and a respective anode (not shown) that is effectively sandwiched between the upper sensor layer 37 and the lower silicon wafer 36 and is connected via a corresponding one of the vias formed in the silicon wafer 36.

Figure 8:
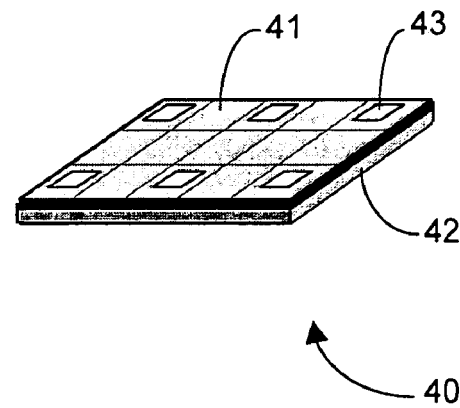
FIG. 8 shows pictorially a single sensor element according to the invention cut from the wafer shown in FIG. 7.

As shown in FIG. 8, the wafer 35 is now scribed along the scribe lines so as to produce individual sensor chips 40, which in the specific example shown in the figure comes 5×3 pixel elements in a two-layer structure having an upper layer 41 formed of a silicon wafer and having integrated therewith pixel electronics reference 23 in FIG. 4 and having a lower layer 42 on which the sensor elements themselves are deposited. Toward the upper layer 41 are also formed terminal nodes to allow for the equal connection to the pixel electronics of power, I/O and control connections. This is typically done by means of terminal pads 43, which are metallized on the outer surface of the silicon wafer in known manner and formed already in an earlier stage of the fabrication corresponding to the silicon wafer 20 shown in FIG. 2. In use, access to an individual pixel in the sensor array is achieved by addressing the required pixel and the location of an active pixel in the sensor array is likewise determined by decoding its address. In a sensor array having, for example, 1024 pixels the required address bus has 10 lines and in general the required address bus for a pixel array having N pixels has $\log_2 N$ lines. Thus far fewer terminal nodes are required than sensor inputs.

As explained above, pixel sensors are deposited on the lower layer 42, whose outer surface constitutes a common cathode such that the anodes of each sensor element are connected to a corresponding sensor input of the pixel electronics via a corresponding through-connect or via formed through the body of the silicon wafer 41. Likewise, the terminal pads 43 are formed on the outer surface of the silicon layer 41 rather than being brought to edge connections as is typically done in hitherto-proposed configurations. This greatly facilitates mounting of the pixel array and allows multiple pixel arrays to be cascaded in edge-to-edge relationship, resulting in a much more compact configuration with greatly reduced dead space compared to hitherto-proposed configurations.

Figure 9A:
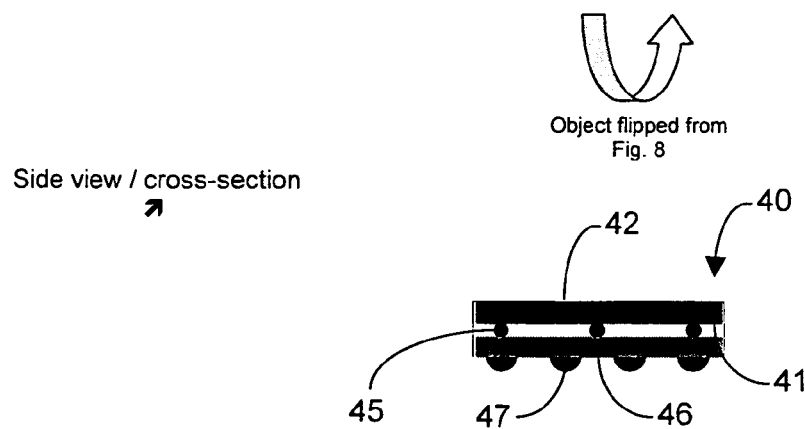
FIGS. 9*a* and 9*b* show respectively pictorially top and side elevations of the pixel sensor of FIG. 8 mounted via bump-bonds to a ceramic board in a composite encapsulation having bump-bonds for mounting directly to a PCB motherboard without the need for wire-bonding.
Figure 9B:
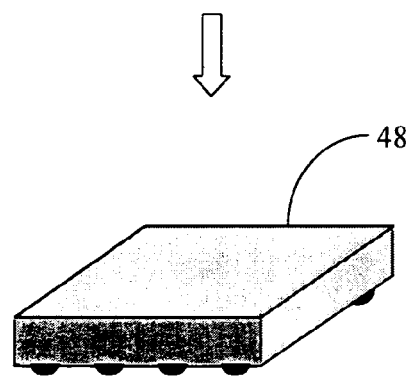
Figure 10:
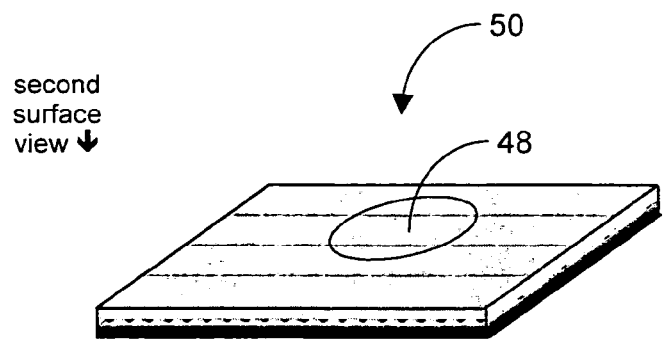
FIG. 10 shows pictorially a two-dimensional array of encapsulated pixel sensors as shown in FIG. 9 mounted in side-to-side relationship so as to form a composite large array sensor.

FIGS. 9a and 9b show how the pixel sensor module 40 shown in FIG. 8 may be encapsulated so that the common cathode of the pixel sensor layer 42 is uppermost and the terminal pads 43 are connected via bump-bonds 45 to a ceramic board 46 which are low density and easy to manufacture. The ceramic board 46 feeds bump-connections 47 through to surface mounted pins or bores (e.g., PGA or BGA standard). The complete arrangement is encapsulated so as to form a module 48 that is easily mounted on to a PCB motherboard. The module 48 is very easy to handle and can be mounted as one of many identical elements that are mounted edge-to-edge so as to form a two-sensor having a much larger surface area and minimum dead space as shown pictorially in FIG. 10 where a large sensor array 50 is formed by mounting multiple sensor modules 48 in edge-to-edge arrangement, all surface mounted to a standard PCB assuming that BGA encapsulation is employed. If, alternatively, PGA encapsulation were employed, then the modules 48 would typically be mounted in IC sockets.

It is obviously important that the vias are not short-circuited by the silicon wafer 20. This might conceivably occur, for example, if the vias are filled with metal since the junction of the metal vias with the bulk silicon could form a Schottky diode. During actual use of the sensor, such a Schottky diode could become reverse biased and conduct, thus creating a short-circuit between the vias.

In order to militate against the possibility of conduction between the vias through the bulk of the silicon wafer, the integrity of the insulation between the vias in the silicon wafer it must be ensured. To this end, the insulating properties of the silicon wafer can be enhanced by suitable choice of the silicon wafer. Generally, it will always be a type of which the surface (first surface) is prepared in a standard manner for IC (e.g. CMOS) manufacturing. However, the bulk material can be varied so as to provide better insulation properties. Typical variations are:

1. Standard bulk silicon substrate (homogenous all the way through). This would be the "normal" choice.

2. Silicon on Insulator (SoI) substrate.
3. Epitaxial layer silicon substrate.

It will be apparent that modifications may be made to the assembly without departing from the scope of the invention as claimed which resides, principally, in the provision of ohmic connections that are formed in the silicon wafer so as to allow ohmic connection therethrough of a pixel sensor element to the input connection of the corresponding pixel electronics that is integrated into the silicon wafer on the top side thereof. By such means, the need to interconnect each sensor element to the corresponding electronics in the silicon wafer via bump-connections is avoided thus allowing a much more compact assembly to be produced. Furthermore, since the I/O and controls pads may easily be mounted on the top surface of the silicon, this obviates the need to provide connections along the edge of the pixel assembly, thus rendering the assembly still more compact and allowing easy expansion of the pixel array by mounting multiple modules edge-to-edge with minimum intervening dead space.

Figure 11:
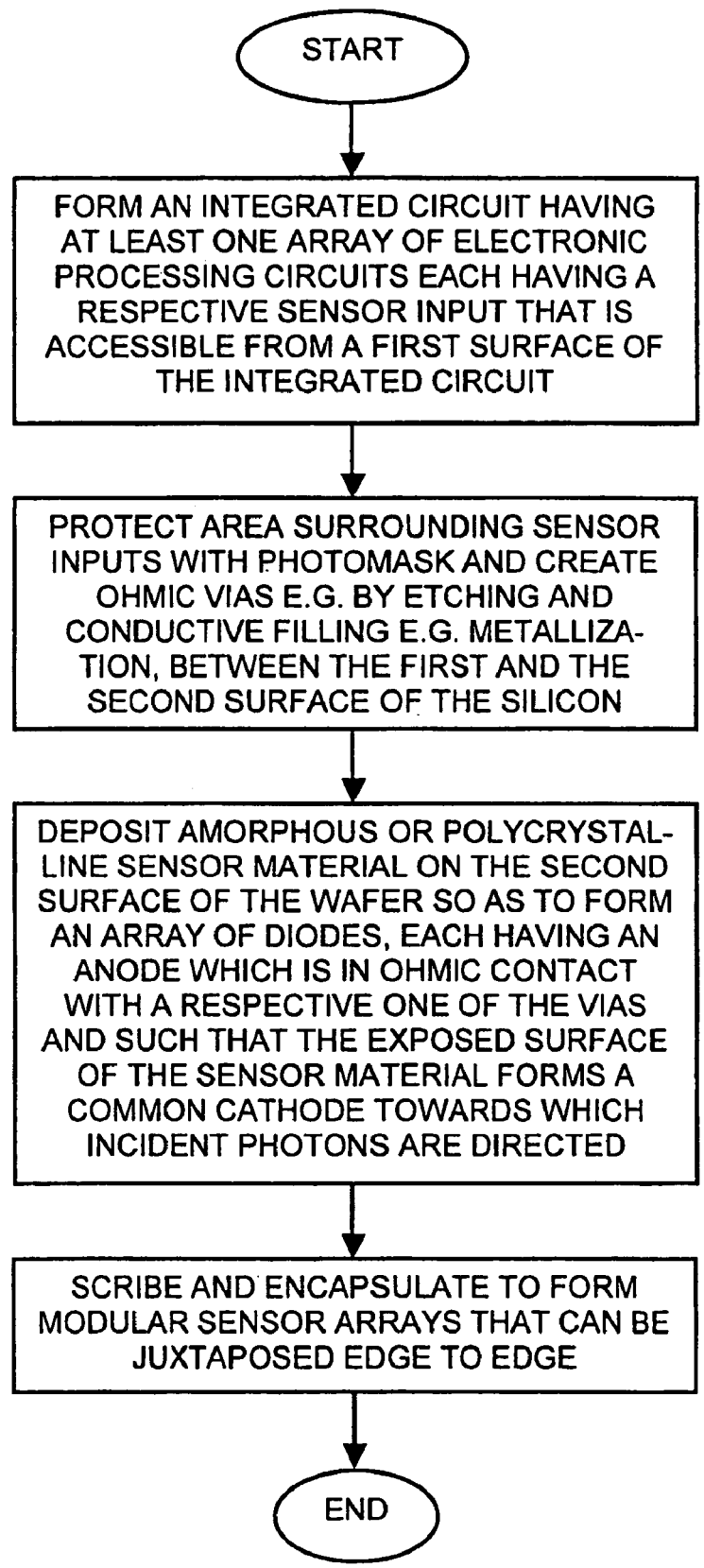
FIG. 11 is a flow diagram summarizing the manufacturing process of a pixel sensor according to the invention.

FIG. 11 is a flow diagram summarizing the essential features of the above-described manufacturing process of a pixel sensor according to the invention, wherein the sensor material is deposited on the second surface of the wafer and the sensor elements are electrically connected through the electrically conductive vias (31) to the respective sensor inputs.

Whilst, in the preferred embodiment as described above, the sensor elements are themselves deposited using mercury iodide on to the silicon wafer, it will be appreciated that other materials may be used such as cadmium zinc telluride and cadmium mercury iodide. Likewise, the invention contemplates providing the sensor elements as a completely separate integrated unit, whose multiple sensor elements may each be connected to a respective pixel electronics unit in the silicon layer via the ohmic contact formed therethrough according to the invention. Thus the invention also contemplates the situation where the sensor elements and the sensor electronics are formed in discrete layers, which are bonded together rather than being formed as a monolithic structure.

Furthermore, while a preferred embodiment has been described with regard to CMOS circuitry, it will be appreciated that the principles of the invention are applicable to other technologies.

Although use of such sensors in nuclear and medical imaging systems has been mentioned, it is to be noted that the invention is not limited to any particular application. Thus, other applications of the invention will be apparent to one skilled in the art and include, without limitation, X-ray computed tomography; night vision sensors; standard medical and industrial X-ray devices; nuclear medicine PET/SPECT sensors; particle detectors; X-ray diffraction detectors and others.

It should also be noted that in the fabrication stage shown in FIG. 8, the wafer does not need to be divided along every scribe line. Thus, in the example described in the preferred embodiment where each pixel sensor comprises an array of 3×5 pixels, a larger array of 6×5 pixels can be fabricated simply by not scribing between two adjacent pixel arrays. Likewise, an array of 6×10 pixels can be formed by suitable division of the wafer 20. In saying this, it is of course to be noted that the invention is not limited to any specific number or arrangement of pixels in each pixel array and the usual cost/yield considerations apply. Thus, by reducing the number of pixels in each array, fewer pixels are wasted upon discarding faulty pixel arrays. Theoretically, one large pixel array could be formed using the complete area of the wafer; but in this case a fault in a single pixel would require that the complete wafer be discarded.

In the preferred embodiment, the electronic processing circuits include amplifiers and further processing circuitry. This allows incident photons to trickle charge the pixel array and to be counted on impact. However, this also is not intended to limit the invention since at their most basic the electronic processing circuits can be simply capacitors that store the incoming charge, in a manner somewhat analogous to a CCD, where charge is read out sequentially similar to a shift register.

In the embodiments so, far described, the sensor inputs together with terminal nodes are formed toward a first surface of the CMOS wafer and the sensor elements are either deposited on the opposite, second surface or otherwise fixed thereto in exact registration with the sensors inputs on the first surface. This results in the sensors inputs and the sensor elements themselves being disposed on opposite surfaces of the wafer and ohmic connection between them is achieved by means of electrically conductive vias that extend through the wafer. In such case, the terminal nodes must be accessible from the first surface of the CMOS wafer opposite the sensor elements so as to allow external connection thereto. This requires that the insulating silicon oxide layer covering the terminal nodes be removed so as expose the terminal nodes. External connection may then be achieved via terminal pads metallized on the first surface of the wafer in electrical contact with the exposed terminal nodes or directly on to the exposed vias.

However, the same principle may be used in reverse, whereby the terminal nodes are effectively dislocated by means of electrically conductive vias to an opposite surface of the wafer. This allows the sensor material to be deposited directly on the same surface of the wafer as the sensor inputs, thus obviating the need in this case for electrically conductive vias to be formed for these routing these connections to an opposite surface of the wafer. In other words, the sensor elements and the connections to the terminal nodes are always disposed on opposite surfaces of the wafer, although the sensor inputs and the terminal nodes are formed on the same surface. In the first case, as described above with reference to FIGS. 1 to 11, where the sensor elements are deposited on the second surface of the wafer, they are connected to the sensor inputs by respective electrically conductive vias and access to the terminal nodes is provided from the first surface for allowing direct connection thereto, for example by terminal pads. In the second case, the sensor elements are deposited directly on the same surface as the sensor inputs. In this case, the terminal nodes are connected by respective electrically conductive vias to the opposite surface of the wafer, where the actual terminal pads may be formed, or other connection to the now dislocated terminal nodes may be ensured. Access to the terminal nodes from the first surface of the wafer is, in this case, prevented since otherwise the sensor elements would short-circuit the terminal nodes. Such short-circuiting is avoided by the silicon dioxide insulating layer that covers the terminal nodes before the sensor elements are deposited.

In this context, it is to be noted that in CMOS technology, the CMOS layer is covered by an insulating layer of silicon oxide, which must be removed if a circuit element is to be exposed in order to allow actual electrical connection thereto. Thus, in the first case where the sensor elements are deposited on the second surface of the wafer, the terminal nodes are exposed and metallized on the first surface. In the second case, where the sensor elements are deposited on the first surface of the wafer, the sensor inputs are exposed to allow electrical connection of the sensor elements. In this case, the terminal nodes are ohmically coupled to the second surface of the wafer by the electrically conductive vias and terminal connections thereto may be formed either by means of terminal pads or by direct connection to the ohmic diffusions of the vias. Thus, in both cases the sensor inputs and the terminal nodes are formed toward the first surface of the wafer, although depending on the circuit topology, access may be denied thereto by the silicon oxide insulation layer.

It should be noted that terminal nodes may be formed in the sensor chip for allowing any required external connection.

It should also be noted that the invention contemplates other approaches for depositing the electrically conductive vias than the specific process described above with reference to FIG. 11. For example, prior to sending the wafer to the CMOS foundry for fabricating the pixels 23 comprising the sensor electronics shown in FIG. 4, the electrically conductive vias may be pre-formed in the native silicon wafer.

Figure 12:
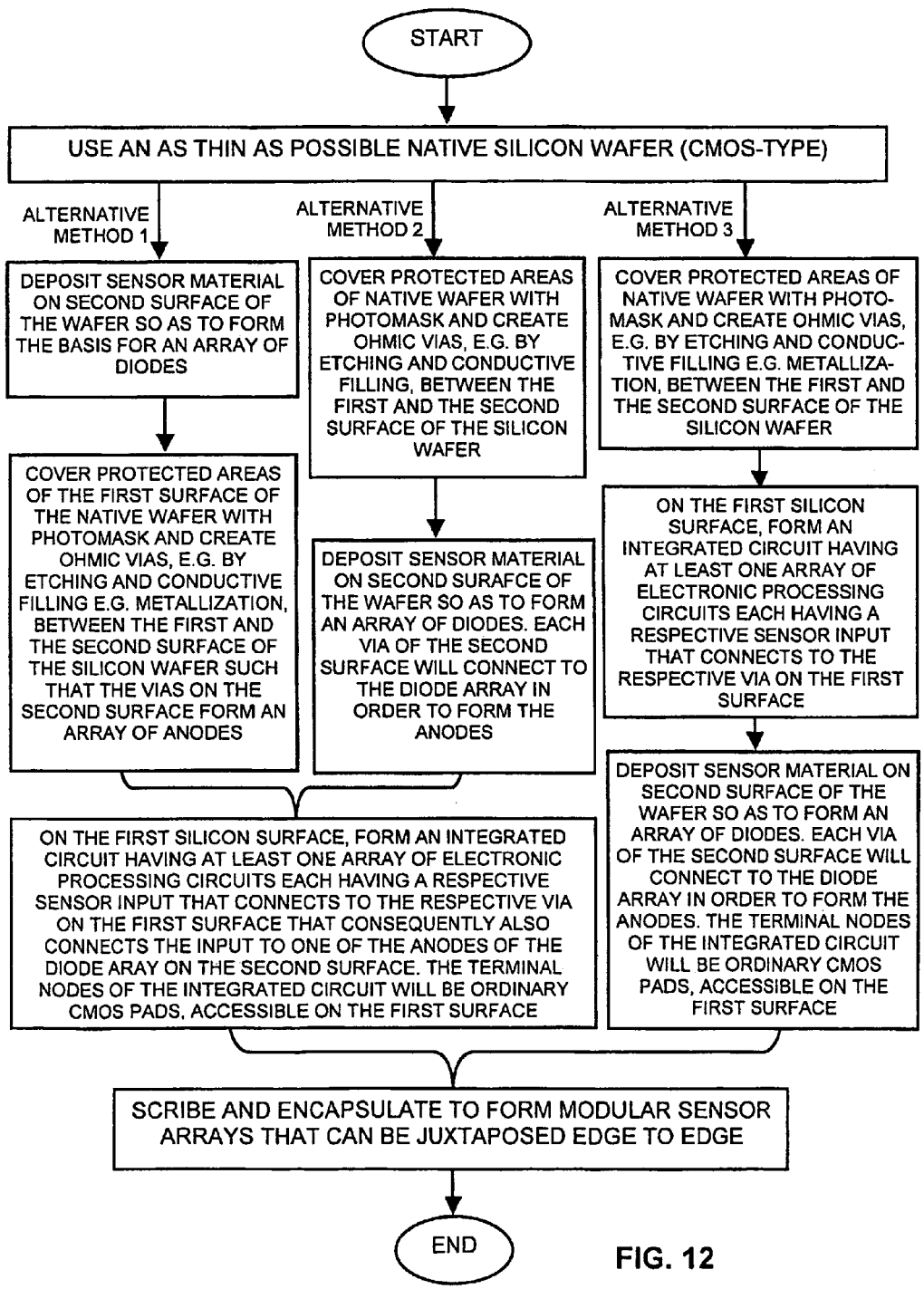
FIG. 12 is a flow diagram summarizing alternative manufacturing processes of a pixel sensor according to the invention.

FIG. 12 is a flow diagram summarizing the principal operations carried out in such a method of fabrication in accordance with various embodiments. Thus, according to a first embodiment, sensor material is deposited on the second surface of the wafer so as to form the basis for an array of diodes. The thus exposed surface of the sensor material will form a common cathode on to which incident radiation will impinge. The anodes will abut the wafer, but are only realized when actual connections are made thereto by the electrically conductive vias that will connect them to the sensor electronics, when this is eventually formed. Electrically conductive vias are formed in the native silicon wafer using any of the techniques described above. Thus, as shown in FIG. 12, areas of the native wafer that are to be protected may be covered with photomask and the vias created by etching and conductive filling e.g. metallization through the wafer. Once this is done, the points of contact of the respective vias with the sensor material form the respective anodes of the sensor elements or pixels. The pre-processed silicon wafer is now sent to the CMOS foundry where the pixels 23 are formed in normal manner so that either the sensor inputs or the terminal nodes are in exact registration with the vias, depending on whether the sensor material is to be deposited on the opposite surface of the same surface of the pixels 23, as explained above. In either case, at the end of the process the terminal nodes and the sensor material are deposited on opposite surfaces of the wafer and either the sensors are connected to their respective sensor inputs by means of the pre-formed electrically conductive vias or, alternatively, the terminal pads are connected to their respective terminal nodes by means of the electrically conductive vias. As noted above, the connections to the terminal nodes need not be via metallized pads, since direct connection to the ohmic diffusion may be made if required.

In an alternative method, the electrically conductive vias are formed first in the native wafer as explained above. The sensor material is then deposited on the second surface of the wafer so as to form the basis for an array of diodes. As explained above, the thus exposed surface of the sensor material will form a common cathode on to which incident radiation will impinge. The anodes will abut the wafer at the respective points of contact with the already-formed vias, but are only realized when actually connections are made thereto by the sensor electronics, which is now formed at the CMOS foundry.

According to a third approach, the electrically conductive vias are formed first in the native wafer as explained above. The processing electronics is now formed at the CMOS foundry in precise registration with the electrically conductive vias. The sensor material is then deposited on the second surface of the wafer so as to form an array of diodes. The exposed surface of the sensor material forms a common cathode on to which incident radiation will impinge. The anodes abut the wafer at the respective points of contact with the already-formed vias, which are connected to the sensor electronics.

Figure 13:
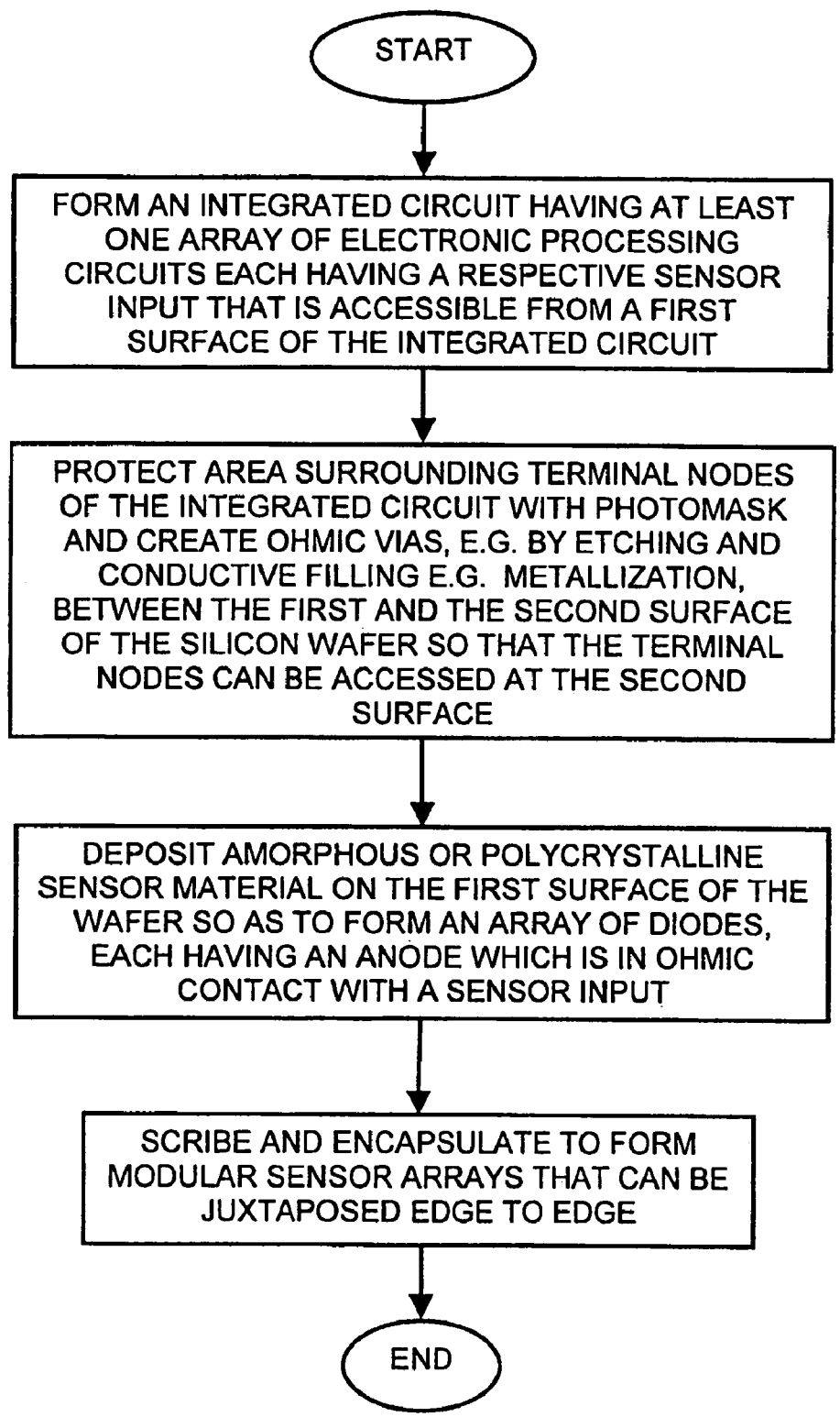
FIG. 13 is a flow diagram summarizing an alternative manufacturing process of a pixel sensor according to the invention.

FIG. 13 is a flow diagram summarizing the essential features of the above-described manufacturing process of a pixel sensor according to the invention, wherein the sensor material is deposited on the first surface of the wafer and the terminal pads are electrically connected through the electrically conductive vias to the respective terminal nodes. Although in FIG. 13 only one manufacturing approach is shown, it will be appreciated that any one of the approaches described above with reference to FIG. 12 may be employed also in the case where the terminal pads are electrically connected to the terminal nodes through respective electrically conductive vias.

In all cases, after the wafer is processed it is scribed and encapsulated to form modular sensor arrays that can be juxtaposed edge to edge.

The invention has been described with particular reference to two distinct configurations: one where the sensor inputs are dislocated from the first surface to the second surface; and the second where the terminal nodes are dislocated from the first surface to the second surface. These configurations have been described as being what is currently believed to be of most practical importance. But it is clear that the teachings of the invention would allow hybrid configurations also, where for example the sensor inputs are dislocated as well as specific ones of the terminal nodes. Thus, in the appended claims the provision of an electrically conductive via in respect of either each pixel or each terminal node is not intended to preclude the possibility of providing an electrically conductive via in respect of each pixel and some of the terminal nodes.

The invention claimed is:

1. A method for fabricating a sensor array having a plurality of pixels, each pixel including an electronic processing circuit having a sensor input for coupling a sensor element to the electronic processing circuit, the sensor array further having a plurality of terminal nodes for external connection to respective electronic processing circuits of multiple pixels of power, I/O and control connections, the method comprising:

integrating the electronic processing circuits on a first surface of a wafer so as to form an integrated circuit having at least one array of said electronic processing circuits with the sensor inputs and the terminal nodes on the first surface of the wafer;

in respect of each pixel, providing an electrically conductive via through the wafer extending from the respective sensor input to a second surface of the wafer opposite the first surface; and growing amorphous or polycrystalline sensor material on the second surface of the wafer so as to form an array of sensor elements, an unexposed surface of the sensor material forming multiple electrodes of a first polarity each in registration and in ohmic contact with a corresponding one of the electrically conductive vias and such that an exposed surface of the sensor material forms a common electrode having a polarity that is opposite to the first polarity.

2. A method for fabricating a sensor array having a plurality of pixels, each pixel including an electronic processing circuit having a sensor input for coupling a sensor element to the electronic processing circuit, the sensor array further having a plurality of terminal nodes for external connection to respective electronic processing circuits of multiple pixels of power, I/O and control connections, the method comprising:

integrating the electronic processing circuits on a first surface of a wafer so as to form an integrated circuit having at least one array of said electronic processing circuits with the sensor inputs on the first surface of the wafer;

providing a plurality of electrically conductive vias through the wafer extending to a second surface of the wafer opposite the first surface, each of said electrically conductive vias being in registration with a respective terminal node in the sensor array; and growing amorphous or polycrystalline sensor material on the second surface of the wafer so as to form an array of sensor elements, an unexposed surface of the sensor material forming multiple electrodes of a first polarity each in registration and in ohmic contact with a corresponding one of the electrically conductive vias and such that an exposed surface of the sensor material forms a common electrode having a polarity that is opposite to the first polarity.

3. The method according to claim 1, further including:
forming on the second surface of the wafer a plurality of metallized terminal pads each in ohmic contact with a respective one of the terminal nodes.

4. The method according to claim 1, wherein the integrated circuit includes multiple arrays of pixels and there is further included:
dividing the integrated circuit into discrete sensor arrays.

5. The method according to claim 1, further including:
assembling multiple sensor arrays edge to edge so as to form a composite sensor array having an extended surface area.

6. The method according to claim 1, further including:
thinning down the wafer from a reverse side thereof so as to remove the bulk of the wafer.

7. The method according to claim 1, wherein the wafer is pre-thinned prior to providing the electrically conductive vias through the wafer.

8. The method according to claim 1, wherein providing electrically conductive vias through the wafer includes:
coating the first surface of the wafer with photomask apart from exposed areas where the vias are to be formed; and
implanting the wafer with a material to which the photomask is impervious, so that said material penetrates only the exposed areas and creates a local increase in the conductivity of the wafer to the second surface thereof, thus forming a matrix of conductive vias.

9. The method according to claim 8, further including:
producing a complementary photomask that covers said area of the wafer on the second surface thereof and is in precise registration with the photomask that is disposed on the first surface thereof.

10. The method according to claim 8, wherein the wafer is based on silicon and said material is a p-type impurity.

11. The method according to claim 1, wherein providing electrically conductive vias through the wafer includes:

providing a photomask on the second surface only of the wafer so as to expose the wafer in direct registration with areas on the first surface of the wafer where the vias are to be formed;
partially etching holes through the wafer from the second surface toward the first surface so as to form partial bores; and
filling the bores with conductive material.

12. The method according to claim 1, wherein providing electrically conductive vias through the wafer includes:
partially etching holes through the wafer from the second surface so as to form partial bores;
implanting the wafer from the first surface thereof with a material to which the photomask is impervious, so that said material renders the wafer conductive directly abutting each area where vias are to be formed; and
filling the partial bores with conductive material which abuts the wafer and completes the ohmic contact to the second surface of the wafer.

13. The method according to claim 1, wherein the electrically conductive vias are formed in the wafer prior to formation of the processing circuits by:
coating the first surface of the wafer with photomask for protecting an area surrounding an intended location of each via, whilst leaving said area exposed; and
implanting the wafer with a material to which the photomask is impervious, so that said material penetrates only said area and creates a local increase in the conductivity of the wafer from the intended location of each via to the second surface thereof, thus forming a matrix of conductive vias through the wafer.

14. The method according to claim 1, wherein the electrically conductive vias are formed in the wafer prior to formation of the processing circuits by:
coating the first surface of the wafer with photomask for protecting an area surrounding an intended location of each via, whilst leaving said area exposed, and
implanting the wafer with a material to which the photomask is impervious, so that said material penetrates only said area and creates a local increase in the conductivity of the wafer from the intended location of each via through the wafer to the second surface thereof, thus forming a matrix of conductive vias through the wafer.

15. The method according to claim 1, wherein the electrically conductive vias are formed in the wafer prior to formation of the processing circuits by:
providing a photomask on the second surface only of the wafer so as to expose the wafer in direct registration with respective locations on the first surface of the wafer of intended vias,
etching holes through the wafer from the second surface to said locations, whilst not etching all the way through the wafer so as to form bores; and
filling the bores with conductive material.

16. The method according to claim 1, wherein the electrically conductive vias are formed in the wafer prior to formation of the processing electronics by:
partially etching holes through the wafer from the second surface so as to form partial bores;
implanting the wafer from the first surface thereof with a material to which the photomask is impervious, so that said material penetrates only the intended via and renders the wafer conductive at an exposed area thereof; and filling the partial bores with conductive material which abuts the wafer and completes the ohmic contact to the second surface of the wafer.

17. The method according to claim 13, wherein the sensor material and the terminal connections are formed on the wafer prior to formation of the processing circuits.

18. The method according to claim 1, wherein the integrated circuit includes multiple arrays of electronic processing circuits separated by scribe lines and there is further included:
scribing along the scribe lines so as to produce individual sensor chips.

19. The method according to claim 1, further including:
connecting terminal pads metallized on an outer surface of the wafer via bump-bonds to a ceramic board that feeds bump-connections through to surface mounted pins or bores; and
encapsulating so as to form a module.

20. The method according to claim 19, further including:
mounting several of said modules edge to edge so as to form a two-dimensional sensor of larger surface area than a single module.

21. The method according to claim 1, when used to fabricate a sensor array or module for a high energy photon imaging detector.

22. A sensor array or module manufactured according to the method of claim 1.

23. A multi-pixel sensor array comprising:
a wafer having integrated therein on a first surface of the wafer multiple electronic processing circuits each in respect of a respective pixel so as to form an integrated circuit having at least one array of electronic processing circuits each electronic processing circuit having a respective sensor input on the first surface of the wafer, the sensor array further having a plurality of terminal nodes on the first surface of the wafer for external connection to respective electronic processing circuits of multiple pixels of power, I/O and control connections,
in respect of each pixel, an electrically conductive via through the wafer extending from the respective sensor input to a second surface of the wafer opposite the first surface, and
a layer of amorphous or polycrystalline sensor material grown on the second surface of the wafer so as to form an array of sensor elements, so that an unexposed surface of the sensor material forms multiple electrodes each in registration and in ohmic contact with a corresponding one of the electrically conductive vias, and an exposed surface of the sensor material forms a common electrode having a polarity that is opposite to the first polarity.

24. A multi-pixel sensor array comprising:
a wafer having integrated therein on a first surface of the wafer multiple electronic processing circuits each in respect of a respective pixel so as to form an integrated circuit having at least one array of electronic processing circuits each electronic processing circuit having a respective sensor input on a first surface of the wafer, the sensor array further having a plurality of terminal nodes for external connection to respective electronic processing circuits of multiple pixels of power, I/O and control connections,
in respect of each terminal node, an electrically conductive via through the wafer extending from the respective terminal node in the sensor array to a second surface of the wafer opposite the first surface, and
a layer of sensor amorphous or polycrystalline material grown on the first surface of the wafer so as to form an array of sensor elements, so that an unexposed surface of the sensor material forms multiple electrodes each in registration and ohmic contact with the respective sensor input of a corresponding electronic processing circuit, and an exposed surface of the sensor material forms a common electrode having a polarity that is opposite to the first polarity.

25. The sensor array according to claim 23, being configured for use in a high energy photon imaging detector.

26. A sensor module comprising an encapsulated sensor array according to claim 23 including:
terminal pads metallized on an outer surface of the wafer via bump-bonds to a ceramic board that feeds bump-connections through to surface mounted pins or bores.

27. A multi-module sensor assembly comprising a plurality of the sensor modules according to claim 26 mounted edge to edge so as to form a two-dimensional sensor of larger surface area than a single module.

28. The method according to claim 2, further including:
forming on the second surface of the wafer a plurality of metallized terminal pads each in ohmic contact with a respective one of the terminal nodes.

29. The method according to claim 2, wherein the integrated circuit includes multiple arrays of pixels and there is further included:
dividing the integrated circuit into discrete sensor arrays.

30. The method according to claim 2, further including:
assembling multiple sensor arrays edge to edge so as to form a composite sensor array having an extended surface area.

31. The method according to claim 2, further including:
thinning down the wafer from a reverse side thereof so as to remove the bulk of the wafer.

32. The method according to claim 2, wherein the wafer is pre-thinned prior to providing the electrically conductive vias through the wafer.

33. The method according to claim 2, wherein providing electrically conductive vias through the wafer includes:
coating the first surface of the wafer with photomask apart from exposed areas where the vias are to be formed; and
implanting the wafer with a material to which the photomask is impervious, so that said material penetrates only the exposed areas and creates a local increase in the conductivity of the wafer to the second surface thereof, thus forming a matrix of conductive vias.

34. The method according to claim 33, further including:
producing a complementary photomask that covers said area of the wafer on the second surface thereof and is in precise registration with the photomask that is disposed on the first surface thereof.

35. The method according to claim 33, wherein the wafer is based on silicon and said material is a p-type impurity.

36. The method according to claim 2, wherein providing electrically conductive vias through the wafer includes:
providing a photomask on the second surface only of the wafer so as to expose the wafer in direct registration with areas on the first surface of the wafer where the vias are to be formed;
partially etching holes through the wafer from the second surface toward the first surface so as to form partial bores; and
filling the bores with conductive material.

37. The method according to claim 2, wherein providing electrically conductive vias through the wafer includes:

partially etching holes through the wafer from the second surface so as to form partial bores;

implanting the wafer from the first surface thereof with a material to which the photomask is impervious, so that said material renders the wafer conductive directly abutting each area where vias are to be formed; and filling the partial bores with conductive material which abuts the wafer and completes the ohmic contact to the second surface of the wafer.

38. The method according to claim 2, wherein the electrically conductive vias are formed in the wafer prior to formation of the processing circuits by:

coating the first surface of the wafer with photomask for protecting an area surrounding an intended location of each via, whilst leaving said area exposed; and implanting the wafer with a material to which the photomask is impervious, so that said material penetrates only said area and creates a local increase in the conductivity of the wafer from the intended location of each via to the second surface thereof, thus forming a matrix of conductive vias through the wafer.

39. The method according to claim 2, wherein the electrically conductive vias are formed in the wafer prior to formation of the processing circuits by:

coating the first surface of the wafer with photomask for protecting an area surrounding an intended location of each via, whilst leaving said area exposed, and implanting the wafer with a material to which the photomask is impervious, so that said material penetrates only said area and creates a local increase in the conductivity of the wafer from the intended location of each via through the wafer to the second surface thereof, thus forming a matrix of conductive vias through the wafer.

40. The method according to claim 2, wherein the electrically conductive vias are formed in the wafer prior to formation of the processing circuits by:

providing a photomask on the second surface only of the wafer so as to expose the wafer in direct registration with respective locations on the first surface of the wafer of intended vias, etching holes through the wafer from the second surface to said locations, whilst not etching all the way through the wafer so as to form bores; and filling the bores with conductive material.

41. The method according to claim 2, wherein the electrically conductive vias are formed in the wafer prior to formation of the processing electronics by:

partially etching holes through the wafer from the second surface so as to form partial bores;

implanting the wafer from the first surface thereof with a material to which the photomask is impervious, so that said material penetrates only the intended via and renders the wafer conductive at an exposed area thereof; and filling the partial bores with conductive material which abuts the wafer and completes the ohmic contact to the second surface of the wafer.

42. The method according to claim 38, wherein the sensor material and the terminal connections are formed on the wafer prior to formation of the processing circuits.

43. The method according to claim 2, wherein the integrated circuit includes multiple arrays of electronic processing circuits separated by scribe lines and there is further included:

scribing along the scribe lines so as to produce individual sensor chips.

44. The method according to claim 2, further including:

connecting terminal pads metallized on an outer surface of the wafer via bump-bonds to a ceramic board that feeds bump-connections through to surface mounted pins or bores; and encapsulating so as to form a module.

45. The method according to claim 44, further including:

mounting several of said modules edge to edge so as to form a two-dimensional sensor of larger surface area than a single module.

46. The method according to claim 2, when used to fabricate a sensor array or module for a high energy photon imaging detector.

47. A sensor array or module manufactured according to the method of claim 2.

* * * * *